United States Patent
Martens et al.

(10) Patent No.: US 12,191,880 B2
(45) Date of Patent: Jan. 7, 2025

(54) SLOPE ANALOG-TO-DIGITAL CONVERTER AND A METHOD FOR ANALOG-TO-DIGITAL CONVERSION OF AN ANALOG INPUT SIGNAL

(71) Applicant: IMEC VZW, Leuven (BE)

(72) Inventors: Ewout Martens, Heverlee (BE); Jan Craninckx, Boutersem (BE)

(73) Assignee: IMEC VZW, Leuven (BE)

( * ) Notice: Subject to any disclaimer, the term of this patent is extended or adjusted under 35 U.S.C. 154(b) by 198 days.

(21) Appl. No.: 18/083,823

(22) Filed: Dec. 19, 2022

(65) Prior Publication Data

US 2023/0198539 A1      Jun. 22, 2023

(30) Foreign Application Priority Data

Dec. 20, 2021   (EP) .................................. 21215864

(51) Int. Cl.
    *H03M 1/16*   (2006.01)
    *H03M 1/12*   (2006.01)
    *H03M 1/56*   (2006.01)

(52) U.S. Cl.
    CPC ......... *H03M 1/167* (2013.01); *H03M 1/1245* (2013.01); *H03M 1/129* (2013.01); *H03M 1/56* (2013.01); *H03M 1/1215* (2013.01)

(58) Field of Classification Search
    CPC .. H03M 1/167; H03M 1/1245; H03M 1/1215; H03M 1/129; H03M 1/56
    USPC .......................... 341/155, 158, 161, 167, 169
    See application file for complete search history.

(56) References Cited

U.S. PATENT DOCUMENTS

| | | | |
|---|---|---|---|
| 7,471,231 B2 * | 12/2008 | Ang .................... | H03M 1/0682 341/169 |
| 10,205,463 B1 * | 2/2019 | Milkov ............... | H03M 1/1295 |
| 2019/0158772 A1 | 5/2019 | Kim | |

FOREIGN PATENT DOCUMENTS

EP            4047821 A1       8/2022

OTHER PUBLICATIONS

Fu et al: "An SAR ADC Switching Scheme With MSB Prediction for a Wide Input Range and Reduced Reference Voltage", IEEE Transactions on Very Large Scale Integration (VLSI) Systems, vol. 26, No. 12, pp. 2863-2872, 2018.
Yu et al: "A Two-Step Prediction ADC Architecture for Integrated Low Power Image Sensors", IEEE Transactions on Circuits and Systems, pp. 1-12, 2016.

(Continued)

*Primary Examiner* — Khai M Nguyen
(74) *Attorney, Agent, or Firm* — MOSER TABOADA (57) ABSTRACT

A slope analog-to-digital converter, ADC, comprises: an input unit comprising a sampling capacitor, wherein the input unit is configured to during an initial period obtain a sampled value of an analog input signal and, during a conversion period, hold the sampled value across the sampling capacitor; and a comparator configured to determine a most significant bit of the analog input signal during the initial period; wherein the ADC during the conversion period is configured to receive a slope signal and to be adapted based on the determined most significant bit such that the comparator is further configured to adaptively compare the sampled value and the slope signal for converting the sampled value to a digital representation.

12 Claims, 7 Drawing Sheets

(56) References Cited

OTHER PUBLICATIONS

Lee et al: "A 10b Column-wise Two-Step Single-slope ADC for High-speed CMOS Image Sensor", Image sensor workshop, pp. 196-199, 2007.
Lindgren: "A New Simultaneous Multi-Slope ADC Architecture for Array Implementations", IEEE Transactions on Circuits and Systems-II: Express Briefs, vol. 53, No. 9, pp. 921-925, 2006.
Choi et al: "11.1 A time-divided spread-spectrum code based 15pW-detectable multi-channel fNIRS IC for portable functional brain imaging", 2015 IEEE International Solid-State Circuits Conference (ISSCC), Digest of Technical Papers, pp. 196-198, 2015.
Extended European Search Report in EP21215864.6 dated Jun. 10, 2022.

* cited by examiner

SLOPE ANALOG-TO-DIGITAL CONVERTER AND A METHOD FOR ANALOG-TO-DIGITAL CONVERSION OF AN ANALOG INPUT SIGNAL

CROSS-REFERENCE TO RELATED APPLICATIONS

The present application claims the benefit of and priority to EP Patent Application Serial No. 21215864.6, filed Dec. 20, 2021, the entire contents of which is incorporated herein by reference.

TECHNICAL FIELD

The present inventive concept relates to a slope analog-to-digital converter and a method for converting an analog input signal to a digital representation.

BACKGROUND

A slope analog-to-digital converter (ADC) comprises a comparator, which is configured to compare an analog input signal to a slope signal. The slope signal may assume signal levels corresponding to all possible digital values. A digital representation of the analog input signal may be determined based on toggling of an output from a comparator. The output toggles when there is a shift in which of the analog input signal and the slope signal is larger, and this may be used for determining the digital representation of the analog input signal.

The slope ADC may be implemented with few components, such that it may be associated with a small area and/or power consumption. This may be particularly advantageous in a system, wherein a plurality of ADCs is required, e.g. for converting analog input signals from a plurality of sensors, such as when an array of sensors is used.

However, the slope signal needs to loop through all possible signal levels corresponding to all possible digital values of the digital representation. This implies that the analog-to-digital conversion is slow for high resolution digital conversion. Hence, the slope ADC may typically be used with low sampling rates of the analog input signal and/or with low resolution analog-to-digital conversion.

Hence, it would be of interest to provide improvement of speed and/or resolution of a slope ADC.

SUMMARY

An objective of the present inventive concept is to provide a slope ADC which enables a high ratio of speed versus resolution for analog-to-digital conversion of an analog input signal.

These and other objectives of the present inventive concept are at least partly met by the invention as defined in the independent claims. Preferred embodiments are set out in the dependent claims.

According to a first aspect, there is provided a slope analog-to-digital converter (ADC) for converting an analog input signal to a digital representation, said ADC comprising: an input unit comprising a sampling capacitor, wherein the input unit is configured to receive the analog input signal during an initial period for obtaining a sampled value of the analog input signal and wherein the input unit is configured to, during a conversion period, hold the sampled value of the analog input signal across the sampling capacitor between a first terminal and a second terminal of the sampling capacitor; and a comparator which is configured to determine a most significant bit of the analog input signal during the initial period; wherein the ADC during the conversion period is configured to receive a slope signal and to be adapted based on the determined most significant bit such that the comparator is further configured to adaptively compare the sampled value and the slope signal for converting the sampled value to a digital representation.

The comparator is used for determining a most significant bit of the analog input signal during the initial period for obtaining a sampled value of the analog input signal. This implies that the most significant bit is already determined before the conversion period for converting the sampled value of the analog input signal to a digital representation begins. Since the most significant bit represents half of the possible values of the digital representation, this enables the ADC to compare the sampled value potentially only to half of the possible values of the digital representation so as to reduce the conversion period by half. This can be used for (almost) doubling the sampling speed of the analog input signal or for increasing resolution of the digital representation by an additional bit.

The same comparator is used both for determining the most significant bit during the initial period and for comparing the sampled value and the slope signal for converting the sampled value to a digital representation. This implies that no extra components are needed for the determination of the most significant bit. Instead, the comparator is used during the initial period.

The comparator that is used in the slope ADC may be a continuous-time comparator, which is continuously turned on such that the comparator continuously consumes power. Hence, by using the comparator for determining the most significant bit during the initial period, the power that is anyway provided to the comparator is used, so that power provided to the continuous-time comparator is not wasted.

Thanks to the most significant bit being determined during the initial period, the range of the slope signal is decreased. This may be beneficial in the signal being input to the comparator fitting to an operating range of the comparator. Typically, the operating range of the comparator is smaller than a range from ground to a supply voltage. Hence, without the range of the slope signal being decreased, the signal being input to the comparator may need to be attenuated to fit the operating range. This would reduce signal-to-noise ratio of the comparator and/or require larger power consumption of the slope ADC to reduce noise. Such drawbacks may be avoided with the most significant bit being determined during the initial period.

It should be realized that the comparator is, during the initial period, configured to receive the same analog input signal that is used for obtaining the sampled value of the analog input signal. This implies that the slope ADC is configured to convert the analog input signal to a digital representation based on a single sampling of the analog input signal.

The input unit may be a sample and hold unit or a track and hold unit, configured to obtain a sampled value of the analog input signal and to hold the sampled value. Thus, the initial period may be a sampling time, during which the sample and hold unit obtains a sampled value of the analog input signal, or a tracking period, during which the track and hold unit tracks the analog input signal. At the end of the initial period, a sampled value of the analog input signal is obtained and at the same time, the most significant bit of the analog input signal has been determined by the comparator.

The analog input signal may be a differential analog input signal comprising a first analog input signal and a second analog input signal. The comparator may then determine a most significant bit of the analog input signal by simply comparing the first analog input signal to the second analog input signal in order to determine a sign of the differential input signal.

According to an alternative, the analog input signal may be a single-ended input signal. The comparator may then determine a most significant bit of the analog input signal by simply comparing the analog input signal to a fixed reference voltage corresponding to the most significant bit (e.g. 0V, if the input signal may be positive or negative). Thus, it should be realized that the comparator is during the initial period configured to compare only two signal levels to each other. The comparator is then configured to output a zero or one depending on which signal level is higher. Thus, the comparator will not compare the analog input signal to a slope signal during the initial period.

It should be realized that the comparator does not need to be altered between the initial period and the conversion period. Rather, the ADC may be configured to change signals being provided as input to the comparator between the initial period and the conversion period. In particular, the ADC is configured to be adapted based on the determined most significant bit, such that input to the comparator is dependent on the most significant bit. This implies that the comparator is configured to adaptively compare the sampled value and the slope signal by the input to the comparator being adapted based on the determined most significant bit.

The slope ADC may thus be configured to use the comparator differently during the initial period and during the conversion period. The slope ADC may be set into an initial mode, in which the comparator is configured to receive input so as to determine a most significant bit of the analog input signal. The slope ADC may further be set in a conversion mode, which is dependent on the determined most significant bit during the initial mode. The slope ADC may, in the conversion mode, be set such that the comparator is configured to receive input based on the most significant bit such that the comparator does not need to loop through all signal levels of the slope signal corresponding to a resolution of the digital representation in order to convert the sampled value to the digital representation.

It should be realized that the determined most significant bit is at least used for controlling the comparator to adaptively compare the sampled value and the slope signal. However, the most significant bit is not necessarily used directly in the digital representation of the sampled value. Rather, the determined most significant bit may provide an indication of a probable value of the most significant bit. However, the comparator may during the conversion period still use a slope signal that extends into signal levels corresponding to a value of the most significant bit different from the value determined during the initial period. In this manner, the value of the most significant bit may be checked without the ADC necessarily looping through all the possible signal levels corresponding to the resolution of the digital representation. For instance, if a differential input is used and there is a small difference between the differential input values, the comparator may provide an incorrect determination of the most significant bit during the initial period due to noise. This incorrect determination may be corrected thanks to allowing the slope signal to extend into signal levels corresponding to a different value of the most significant bit. Such checking of the most significant bit would be made at an expense of a slightly increased duration of the conversion period as further signal levels of the slope signal would be used.

It should be realized that the comparator being configured to compare the sampled value and the slope signal does not necessarily imply that the sampled value is directly compared to the slope signal. Rather, in some embodiments, the comparator may be configured to receive a combination of the sampled value and the slope signal, wherein the combination of the sampled value and the slope signal is compared to a fixed reference. Further, in some embodiments, the slope signal may be adapted based on the determined most significant bit such that the signal levels assumed by the slope signal are different depending on a value of the most significant bit. In other words, the comparator may be configured to compare two input signals, wherein the input signals involve the sampled value of the analog input signal and a slope signal which assumes varying signal levels.

An output from the comparator may be changed based on a switching of which of the input signals to the comparator is larger. This switching is based on the varying signal levels of the slope signal. The slope ADC may further be configured to identify that the output from the comparator has changed and use this identification for determining the digital representation of the sampled value.

The slope signal is a signal which may assume varying signal levels. The slope signal is a monotonic signal during the conversion period, such that the slope signal is monotonically increasing or monotonically decreasing. For instance, the slope signal may be increased or decreased in steps and may have a constant value between the steps. In other embodiments, the slope signal may be strictly increasing or strictly decreasing.

According to an embodiment, the input unit is a track and hold unit and the input unit is configured to track the received analog input signal thereby obtaining the sampled value of the analog input signal.

Using a track and hold unit provides a suitable manner of obtaining the sampled value of the analog input signal.

According to an embodiment, the ADC comprises at least one switch for selectively controlling an input to the comparator, during the conversion period and in dependence of the determined most significant bit, thereby connecting the input to the comparator to the first terminal or the second terminal of the sampling capacitor.

By using at least one switch, the ADC may control the input to the comparator. Hence, the ADC may be adapted based on the determined most significant bit, using a simple component. A switch may be implemented in a very small area, such that addition of a switch for controlling the input to the comparator allows for the ADC to be compact, while providing a good relation between speed and resolution of the analog-to-digital conversion.

The at least one switch may be used for controlling a timing of connecting the input to the comparator to the first terminal or the second terminal of the sampling capacitor.

According to an embodiment, the at least one switch comprises a plurality of switches for selectively controlling which of the first terminal and the second terminal of the sampling capacitor is connected to the input to the comparator during the conversion period.

Thus, the comparator may be configured to be connected to different terminals of the sampling capacitor, in dependence of the determined most significant bit. Using a plurality of switches, the comparator may be configured to adaptively compare the sampled value and the slope signal based on a control of which of the first terminal and the second terminal is connected to the input to the comparator.

According to an embodiment, the sampling capacitor is configured to be connected to a first terminal of the input to the comparator regardless of the determined most significant bit.

This implies that the comparator always receives the sampled value of the analog input signal at the first terminal. This may provide a simple connection between the comparator and the sampling capacitor. The sampling capacitor may be configured to selectively connect the first terminal of the sampling capacitor to the first terminal of the input to the comparator or connect the second terminal of the sampling capacitor to the first terminal of the input to the comparator.

According to an embodiment, the plurality of switches is configured to control the first terminal or the second terminal of the sampling capacitor not being connected to the input to the comparator during the conversion period to be connected to the slope signal, and wherein the comparator is configured to be further connected at the input to a reference signal during the conversion period.

Thus, the slope signal is connected to either the first terminal or the second terminal of the sampling capacitor. This implies that the plurality of switches is configured to allow a combination of the sampled value and the slope signal to be provided as input to the comparator.

According to an embodiment, the comparator is configured to compare a combination of the sampled value and the slope signal to a first fixed reference voltage independently of the determined most significant bit.

When the comparator is configured to compare a varying signal to a fixed reference voltage, the output of the comparator will always toggle at the same signal level, i.e. at the first fixed reference voltage. This implies that the comparator has a single critical point at the signal level of the first fixed reference voltage.

Thanks to the use of the first fixed reference voltage as input to the comparator, offset, noise, and speed of the ADC may be completely independent of a signal level of the analog input signal to be converted to the digital representation.

According to an embodiment, the plurality of switches is configured to selectively control one of the first terminal and the second terminal of the sampling capacitor to be connected to the input to the comparator, wherein the first terminal of the sampling capacitor is selectively connected to a first terminal of the input to the comparator and the second terminal of the sampling capacitor is selectively connected to a second terminal of the input to the comparator, and wherein the plurality of switches is further configured to selectively connect a slope signal to the first terminal or the second terminal of the comparator, such that the input to the comparator is connected to one of the capacitor terminals and a slope signal.

Thus, the comparator is configured to receive the sampled value of the analog input signal to one of its terminals and the slope signal to the other of its terminals. Thanks to this arrangement of the plurality of switches, the relation between the sampled value of the analog input signal and the slope signal is the same regardless which of the first or the second terminal of the sampling capacitor receives the larger signal during the initial period.

According to an embodiment, the at least one switch is configured to selectively control whether the terminal of the sampling capacitor which is not connected to the input to the comparator is to be connected to ground or to a second fixed reference voltage.

By changing the connection of the terminal of the sampling capacitor which is not connected to the input to the comparator, an offset of the signal value input to the comparator may be provided. This may be used such that the relation between the sampled value of the analog input signal and the slope signal is the same regardless which of the first or the second terminal of the sampling capacitor receives the larger signal during the initial period.

According to an embodiment, the ADC is configured to provide during the conversion period an increasing or decreasing signal value of the slope signal independently of the determined most significant bit.

Thus, the slope signal may always be the same, regardless of the determined most significant bit. This implies that the ADC is configured to always compare the sampled value of the analog input signal to the same slope signal. This implies that the comparator may always loop through the same signal levels during the conversion period.

According to an embodiment, the analog input signal is a differential analog input signal comprising a first analog input signal and a second analog input signal and wherein the comparator is configured to receive the first analog input signal and the second analog input signal on a first terminal and a second terminal of the input to the comparator, respectively, during the initial period.

The ADC may be configured to receive the differential analog input signal using a single input pair. The differential analog input signal may further be connected to the first and second terminal of the input to the comparator during the initial period, such that the comparator may determine whether the first analog input signal is larger than the second analog input signal, or vice versa, during the initial period. Hence, the comparator may determine a most significant bit in determining a sign (positive/negative) of a difference between the first analog input signal and the second analog input signal. The ADC may further be configured to connect one of the terminals of the sampling capacitor to the comparator during the conversion period.

This implies that the ADC is configured to handle differential signals using a comparator with only two input terminals. Each input pair of a comparator may exhibit an offset. Compensating for a single offset of a comparator having a single input pair is relatively straightforward, whereas compensating for different offsets among input pairs is much more complicated. Thus, thanks to the ADC being configured to allow use of a single input pair of the comparator, the ADC facilitates simple offset compensation.

According to an alternative embodiment, the analog input signal is a single-ended signal, wherein the comparator is configured to receive the analog input signal on a first terminal of the input to the comparator and receive a fixed voltage signal on a second terminal of the input to the comparator during the initial period.

The fixed voltage signal may correspond to a central value of the possible values of the analog input signal, i.e. a value corresponding to a value represented by the most significant bit. For instance, if the single-ended signal may be positive or negative, the fixed voltage signal may be 0 V.

Thus, the comparator may, during the initial period, be configured to determine whether the single-ended analog input signal is above or below the fixed voltage signal so as to determine whether a value of the most significant bit is 1 or 0, respectively.

According to an embodiment, the ADC is configured to provide a slope signal which corresponds to levels of the sampled value encompassing more than half of possible values of the digital representation so as to provide a check of determination of the most significant bit.

The digital representation may assume a discrete number of possible values, wherein the discrete number is determined by the resolution (number of bits) of the digital representation. The value of the most significant bit cuts the discrete number of possible values in an upper half and a lower half, wherein each half is represented by a respective value 1 or 0 of the most significant bit.

By the slope signal encompassing more than half of the possible values of the digital representation, the slope signal assumes signal levels corresponding to a value of the most significant bit that differs from the value determined by the comparator during the initial period. This implies that the slope signal may allow the ADC during the conversion period to compare the sampled value of the analog input signal to signal levels around a value represented by the most significant bit. Thus, a check is made whether the value of the most significant bit was correctly determined during the initial period.

This implies that the conversion period may take longer time compared to using the determined most significant bit during the initial period as a true value of the most significant bit. However, a check of the most significant bit allows the ADC to verify whether the determination of the most significant bit determined during the initial period was correct.

Further, if the slope signal would not encompass more than half of possible values of the digital representation, there is a risk that output of the comparator during the conversion period never toggles (because the sampled value of the analog input signal may be outside a range of values to which it is compared). This implies that the digital representation output by the ADC may be undetermined.

According to a second aspect, there is provided a time-interleaved analog-to-digital converter, ADC, comprising: a plurality of slope ADCs according to the first aspect, wherein the plurality of slope ADCs are configured to receive the analog input signal successively in time.

Effects and features of this second aspect are largely analogous to those described above in connection with the first aspect. Embodiments mentioned in relation to the second aspect are largely compatible with the first aspect.

A time-interleaved ADC may use a plurality of ADCs, where the ADCs are used in combination for increasing an overall sampling rate compared to a sampling rate of individual ADCs in the plurality of ADCs.

The slope ADCs being configured to receive the analog input signal successively in time implies that the analog input signal is sequentially provided to different ADCs among the plurality of ADCs. Thus, during the conversion period of a first ADC for determining a first value of the digital representation of the analog input signal, the analog input signal may be provided to a second ADC for obtaining a new sampled value of the analog input signal such that a second value of the digital representation of the analog input signal may be determined. This allows the plurality of ADCs to be jointly used for increasing the sampling rate of the time-interleaved ADC.

The slope ADCs may be configured to receive a common slope signal such that the same slope signal may be re-used for the plurality of slope ADCs.

Slope ADCs may typically be implemented in a compact area, such that slope ADCs may be beneficially used in a time-interleaved ADC comprising a plurality of ADCs such that the time-interleaved ADC may be provided in a small area. The slope ADCs of the first aspect are particularly suitable for being used in a time-interleaved ADC since the slope ADCs of the first aspect allow an improved resolution and/or an improved speed of analog-to-digital conversion. Thus, since a sampling rate of the slope ADCs of the first aspect is large, the number of slope ADCs needed to be used in the time-interleaved ADC may be decreased to allow a very compact implementation of the time-interleaved ADC.

According to a third aspect, there is provided a method for analog-to-digital conversion of an analog input signal, said method comprising: receiving an analog input signal during an initial period at an input unit comprising a sampling capacitor for obtaining a sampled value of the analog input signal; determining a most significant bit of the analog input signal during the initial period; storing the sampled value during a conversion period; adaptively comparing by a comparator the stored sampled value and a slope signal for converting the stored sampled value to a digital representation, wherein input to the comparator is adapted based on the determined most significant bit.

Effects and features of this third aspect are largely analogous to those described above in connection with the first, and second aspects. Embodiments mentioned in relation to the third aspect are largely compatible with the first, and second aspects.

The method allows determining a most significant bit of the analog input signal during the initial period for obtaining a sampled value of the analog input signal. This implies that the most significant bit is already determined before the conversion period for converting the sampled value of the analog input signal to a digital representation begins. This can be used for improving the sampling speed of the analog input signal or for increasing resolution of the digital representation by an additional bit.

BRIEF DESCRIPTION OF THE DRAWINGS

The above, as well as additional objects, features, and advantages of the present inventive concept, will be better understood through the following illustrative and non-limiting detailed description, with reference to the appended drawings. In the drawings like reference numerals will be used for like elements unless stated otherwise.

DETAILED DESCRIPTION

Referring now to FIGS. 1-5, a slope analog-to-digital converter (ADC) 100 according to an embodiment will be described.

Figure 1:
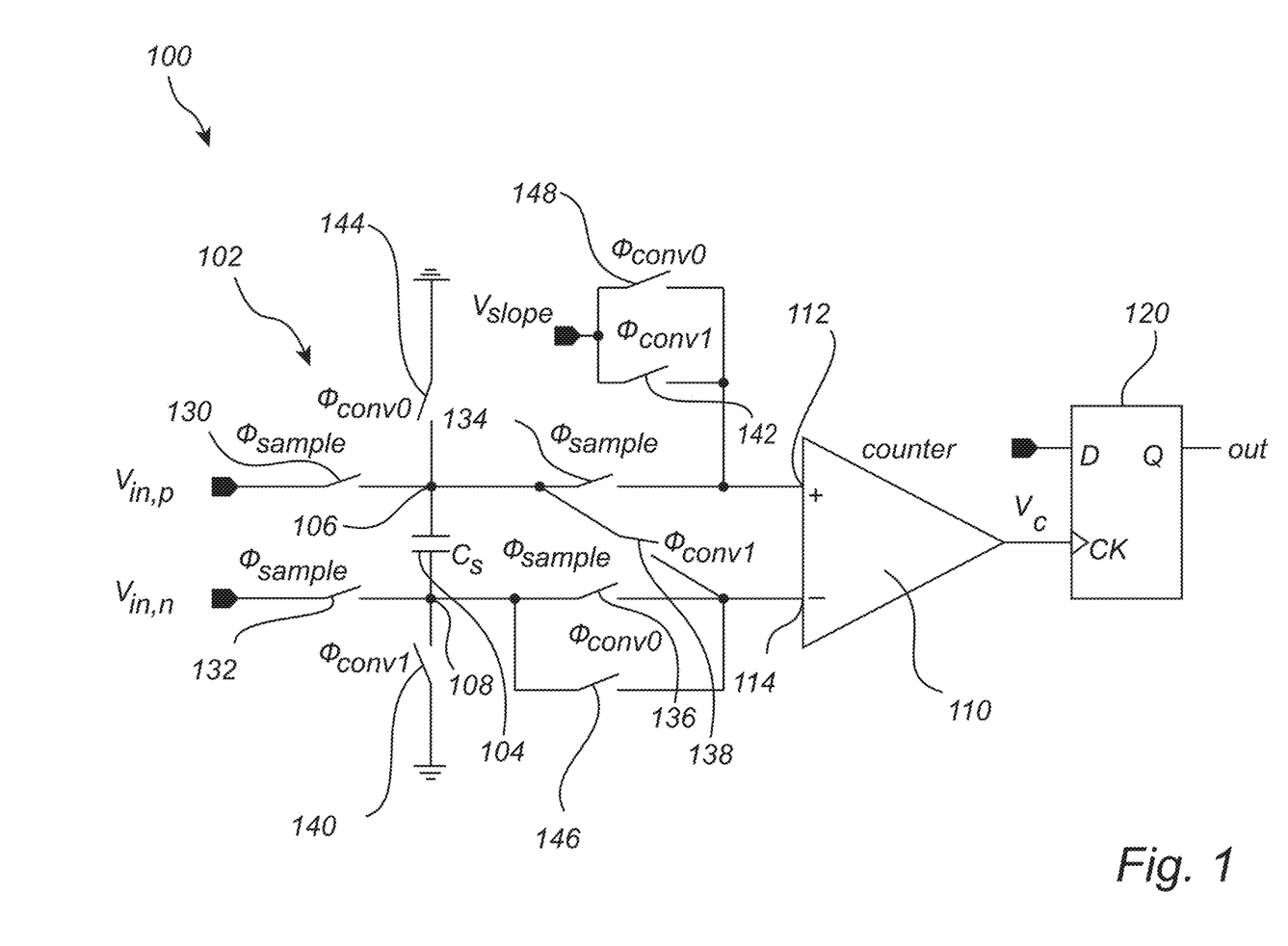
FIG. 1 is a schematic view of a slope analog-to-digital converter (ADC) according to a first embodiment.

The slope ADC 100 comprises an input unit 102 which is configured to receive an analog input signal. The input unit 102 comprises a sampling capacitor 104, which is configured to receive the analog input signal. The analog input signal may be a voltage signal, such that the potential of a terminal of the sampling capacitor 104 may track the analog input signal when the sampling capacitor 104 is connected to receive the analog input signal and may hold (store) a value of the analog input signal when the sampling capacitor 104 is disconnected from the analog input signal. The input unit 102 may thus form a track and hold unit, but it should be realized that the input unit 102 may alternatively form a sample and hold unit.

The analog input signal is shown here as being a differential analog input signal comprising a first analog input signal $V_{in,p}$ and a second analog input signal $V_{in,n}$. The differential analog input signal may be connected to the sampling capacitor 104 such that the sampling capacitor 104 receives the first analog input signal $V_{in,p}$ on a first terminal 106 of the sampling capacitor 104 and receives the second analog input signal $V_{in,n}$ on a second terminal 108 of the sampling capacitor 104. This implies that the sampling capacitor 104 is configured to track and hold the differential input signal across the sampling capacitor 104 between the first terminal 106 and the second terminal 108.

In the embodiments of the slope ADC described below, the slope ADC is described as receiving a differential analog input signal. However, it should be realized that the slope ADC may alternatively receive a single-ended analog input signal. In such case, the sampling capacitor 104 may be configured to receive the analog input signal on the first terminal 106, while the second terminal 108 of the sampling capacitor 104 may be connected to a fixed reference voltage, such as ground.

Analog-to-digital conversion by the slope ADC 100 may involve an initial period, during which a sampled value of the analog input signal is obtained, and a conversion period, during which the sampled value is converted to a digital representation. When the input unit 102 is a track and hold unit, the initial period may be referred to as a tracking period during which the sampling capacitor 104 tracks the analog input signal. At the end of the tracking period, the sampling capacitor 104 stores a sampled value of the analog input signal. The sampled value of the analog input signal is held by the sampling capacitor 104 during the conversion period.

The slope ADC 100 further comprises a comparator 110. The comparator 110 is configured to compare the sampled value of the analog input signal and a slope signal having a monotonically increasing or monotonically decreasing value. The comparator 110 in the slope ADC 100 shown in FIG. 1 is configured to directly compare the sampled value and the slope signal, but it should be realized that a comparison of signal values involving the sampled value and the slope signal may be set up in different ways as will be described below.

Input to the comparator 110 may comprise a first terminal 112 and a second terminal 114. The comparator 110 is configured to provide an output which may toggle between two values depending on whether a signal level received at the first terminal 112 or the second terminal 114 is larger. A toggling of the output by the comparator 110 thus implies that a value of the slope signal crosses the sampled value of the analog input signal.

The slope ADC 100 may further comprise a flip flop or latch circuit 120, which may receive a counter signal that may be synchronized with the slope signal. The flip flop or latch circuit 120 may further be configured to receive the output from the comparator 110. Thus, a toggling of the output by the comparator 110 may read in a counter value from the counter signal into a memory element (e.g., a flip flop or latch circuit 120) thereby providing a digital representation corresponding to the level of the slope signal at the time of toggling of the output from the comparator 110.

According to the present inventive concept, the comparator 110 is configured to determine a most significant bit of the analog input signal already during the initial (tracking) period. The comparator 110 may be configured to receive the analog input signal during the tracking period. In the embodiment shown in FIG. 1, the comparator 110 is configured to receive the first analog input signal $V_{in,p}$ on the first terminal 112 of the input to the comparator 110 and the comparator 110 is configured to receive the second analog input signal $V_{in,n}$ on the second terminal 114 of the input to the comparator 110. It should however be realized that if the analog input signal is a single-ended analog input signal, the comparator 110 may be configured to receive the analog input signal on one terminal of the input to the comparator 110 and the comparator 110 may be configured to receive a fixed reference voltage on the other terminal of the input to the comparator 110, wherein the fixed reference voltage corresponds to a voltage level represented by a most significant bit of a digital representation of the analog signal values.

The comparator 110 may thus compare the first analog input signal $V_{in,p}$ to the second analog input signal $V_{in,n}$ during the tracking period. The output of the comparator 110 thus indicates which of the first analog input signal $V_{in,p}$ and the second analog input signal $V_{in,n}$ is larger. This corresponds to a most significant bit of the digital representation of the analog input signal.

The comparator 110 being used in a slope ADC 100 may be a continuous-time comparator, such that the comparator 110 is anyway turned on during the tracking period. Thus, the comparator 110 will consume power during the tracking period. Thanks to the comparator 110 being connected to receive the analog input signal during the tracking period, the power that is anyway consumed by the comparator 110 may be used for determining a most significant bit during the tracking period. This implies that the slope ADC 100 provides a power-efficient analog-to-digital conversion.

Further, thanks to the comparator 110 determining a most significant bit during the tracking period, the slope ADC 100 may utilize the determined most significant bit to decrease a time required to determine an entire digital representation of the sampled value. The determined most significant bit provides an indication of the sampled value. Thus, the sampled value of the analog input signal may be concluded, even before the conversion period begins, to be within a range of values which is smaller than an entire range of possible values of the analog input signal. This implies that the slope ADC 100 may use a slope signal that during the conversion period only needs to assume signal levels corresponding to the range of values.

During the conversion period, the slope signal may need to be monotonically increased or decreased to cover the entire range of values. By setting the range of values to be smaller than an entire range of possible values of the analog input signal, the time required for the conversion period may be decreased. This may be utilized for increasing a sampling rate of the analog input signal or for increasing a resolution (a number of bits) of the digital representation of the analog input signal output by the slope ADC 100.

The most significant bit determined during the tracking period may be used in the digital representation of the analog input signal. Since the value of the most significant bit cuts the possible values of the analog input signals in half, this implies that the slope signal needs only to assume signal levels in a range of values that is half of the entire range of possible values of the analog input signal. However, the slope ADC 100 may use a slope signal that encompasses more than half of the entire range of possible values of the analog input signal. This implies that a correctness of the most significant bit determined during the tracking period may be checked during the conversion period. Hence, the slope signal may be allowed to extend into signal values corresponding to a different value of the most significant bit than the value determined during the tracking period. The range of values covered by the slope signal may only extend partly into values corresponding to the different value of the most significant bit. It may for instance be expected that the most significant bit would only be incorrectly determined if the sampled value of the analog input signal is around the value represented by the most significant bit, for instance if the value is around 0.

The slope ADC 100 may be configured to be adapted based on the determined most significant bit such that the comparator 110 is configured during the conversion period to adaptively compare the sampled value of the analog input signal and the slope signal. Thus, the input to the comparator 110 may be dependent on the determined most significant bit such that the sampled value is only compared to relevant signal levels of the slope signal. The slope ADC may be adapted based on the determined most significant bit according to different schemes as will be discussed in relation to the embodiments of the slope ADC discussed herein. The input to the comparator 110 may be set in dependence of the determined most significant bit, wherein the input to the comparator 110 is different in the different schemes. By using different inputs to the comparator 110 depending on the determined most significant bit, the slope ADC may allow the slope signal to assume only relevant signal levels such that the analog-to-digital conversion may be efficiently performed.

Further, thanks to the slope signal not necessarily assuming all possible levels of the analog input signal, a necessary operating range of the comparator 110 may be limited. Typically, the operating range of the comparator 110 is smaller than a range from ground to a supply voltage. Hence, the slope ADC 100 may not need to provide any attenuation of signal levels of the sampled value of the analog input signal in order to fit the operating range of the comparator 110. This implies that reduction of signal-to-noise ratio of the comparator 110 based on attenuation of the signal levels of the sampled value is avoided. Further, since noise may not be severely affecting the analog-to-digital conversion, the slope ADC 100 may not need to use extensive power consumption for reduction of noise. Further, if reduction of noise would be of importance, a large size sampling capacitor 104 may be needed. Hence, thanks to the necessary operating range of the comparator 110 being limited in the slope ADC 100, a limited size of the sampling capacitor 104 may be used.

As illustrated in FIG. 1, the slope ADC 100 may comprise a plurality of switches for controlling connections to the sampling capacitor 104 and the comparator 110. Configurations of the slope ADC 100 during the tracking period and the conversion period will now be described in further detail referring to FIGS. 2-5.

The plurality of switches includes sampling switches 130, 132, 134, 136. The sampling switches 130, 132 may allow the analog input signal to be received at the first terminal and the second terminal of the sampling capacitor 104 during the tracking period. The sampling switches 134, 136 may further allow the analog input signal to be received at the input to the comparator 110 during the tracking period.

The plurality of switches further includes conversion switches 138, 140, 142, which are configured to control connections within the slope ADC 100 when the first analog input signal $V_{in,p}$ is larger than the second analog input signal $V_{in,n}$ and conversion switches 144, 146, 148 which are configured to control connections within the slope ADC 100 when the first analog input signal $V_{in,p}$ is smaller than the second analog input signal $V_{in,n}$.

Figure 2:
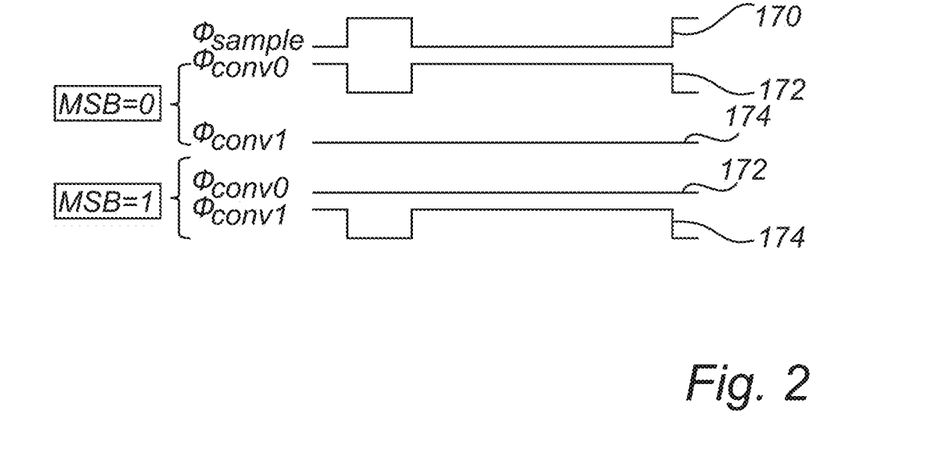
FIG. 2 is a schematic view illustrating control signals to switches of the slope ADC of the first embodiment.

As shown in FIG. 2, a signal 170 to the sampling switches 130, 132, 134, 136 is high during the tracking period and low therebetween. In case the first analog input signal $V_{in,p}$ is smaller than the second analog input signal $V_{in,n}$, i.e. the most significant bit is determined to be 0, the signal 172 to the conversion switches 144, 146, 148 is high during the conversion periods indicating that the switches 144, 146, 148 are closed and low therebetween indicating that the switches 144, 146, 148 are open and the signal 174 to the conversion switches 138, 140, 142 is constantly low. In case the first analog input signal $V_{in,p}$ is larger than the second analog input signal $V_{in,n}$, i.e. the most significant bit is determined to be 1, the signal 172 to the conversion switches 144, 146, 148 is constantly low and the signal 174 to the conversion switches 138, 140, 142 is high during the conversion periods and low therebetween.

Figure 3:
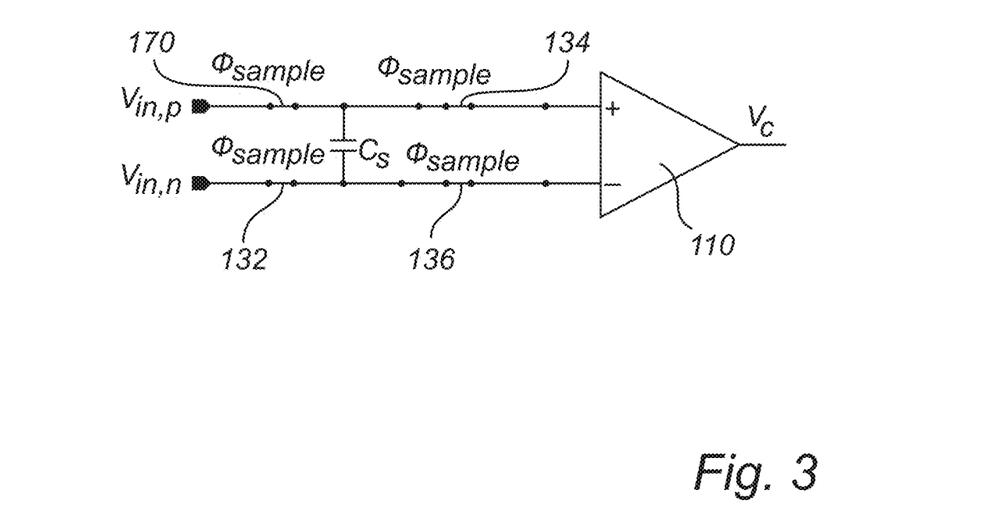
FIG. 3 is a schematic view of a configuration of the slope ADC of the first embodiment during an initial period.
Figure 4:
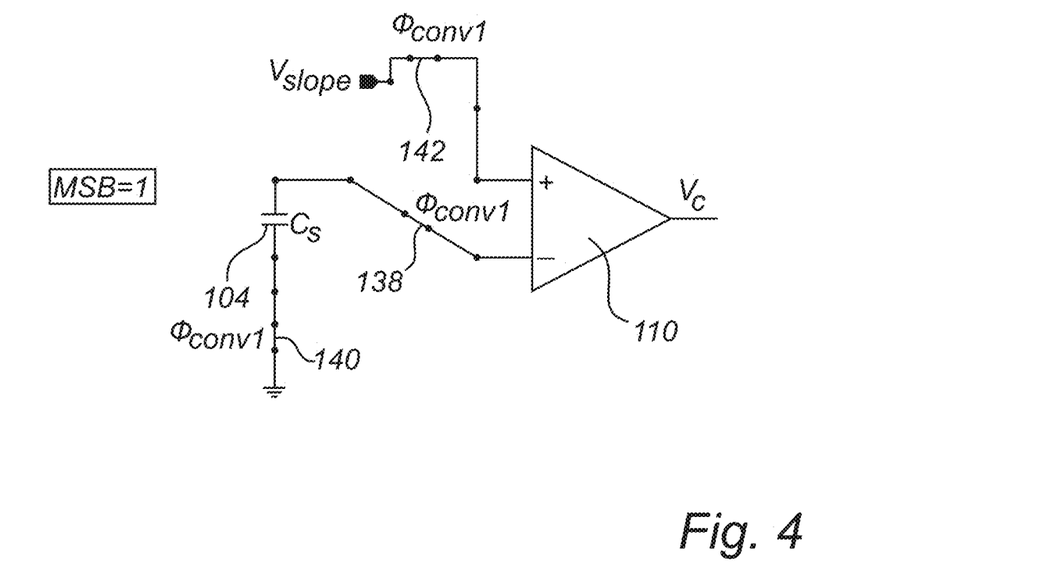
FIG. 4 is a schematic view of a configuration of the slope ADC of the first embodiment during a conversion period, when the most significant bit is determined to be 1.
Figure 5:
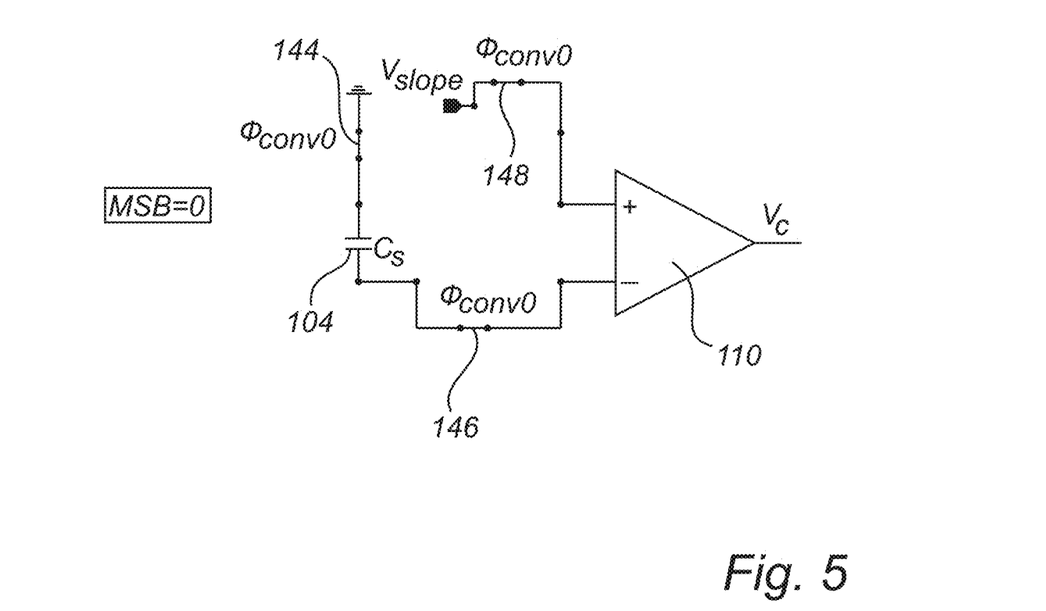
FIG. 5 is a schematic view of a configuration of the slope ADC of the first embodiment during a conversion period, when the most significant bit is determined to be 0.

FIGS. 3-5 further illustrate the configurations of the slope ADC during the sampling period (FIG. 3), during the conversion period for most significant bit being 1 (FIG. 4), and during the conversion period for most significant bit being 0 (FIG. 5).

As illustrated in FIG. 4, when the most significant bit is determined to be 1, i.e. the first analog input signal $V_{in,p}$ is larger than the second analog input signal $V_{in,n}$, the first terminal 106 of the sampling capacitor 104 is connected via conversion switch 138 to a negative terminal 114 of the comparator 110 and the second terminal 108 of the sampling capacitor 104 is connected via conversion switch 140 to ground. Further, the slope signal is connected via conversion switch 142 to a positive terminal 112 of the comparator 110.

As illustrated in FIG. 5, when the most significant bit is determined to be 0, i.e. the first analog input signal $V_{in,p}$ is smaller than the second analog input signal $V_{in,n}$, the first terminal 106 of the sampling capacitor 104 is connected to ground via conversion switch 144 and the second terminal 108 of the sampling capacitor 104 is connected via conversion switch 146 to the negative terminal 114 of the comparator 110. Further, the slope signal is connected via conversion switch 148 to the positive terminal 112 of the comparator 110.

Thus, the plurality of switches 138, 140, 144, 146 may selectively control which of the first terminal 106 and the second terminal 108 of the sampling capacitor 104 that is connected to the input to the comparator 110 during the conversion period. The sampling capacitor 104 may further be connected to the negative terminal 112 of the comparator 110 regardless of the determined most significant bit.

With the configuration illustrated in FIGS. 1-5, a signal received on the negative terminal 114 of the comparator 110 may be slightly different depending on the determined most significant bit. The analog input signal received at the input to the sampling capacitor 104 may be attenuated to an input signal received on the negative terminal 114 of the comparator 110. Thus, the signal V_ received on the negative terminal 114 of the comparator 110 may be given as:

$$V_- = \begin{cases} \frac{C_s - C_p/2}{C_s + C_p} V_{in} + \frac{C_p}{C_s + C_p} V_{cm,in}, & V_{in} > 0 \\ -\frac{C_s + C_p/2}{C_s + C_p} V_{in} + \frac{C_p}{C_s + C_p} V_{cm,in}, & V_{in} < 0 \end{cases}$$

where $C_s$ is the capacitance of the sampling capacitor, $C_p$ is the capacitance of the input terminals 112, 114 of the comparator 110, $V_{in} = V_{in,p} - V_{in,n}$, and $V_{cm,in}$ is a common-mode input voltage.

The input to the comparator, or at least the negative terminal 112, may be reset before the conversion time in order to remove the signal-dependent effect of attenuation of the analog input signal at cost of some extra time to do the reset.

Figure 6:
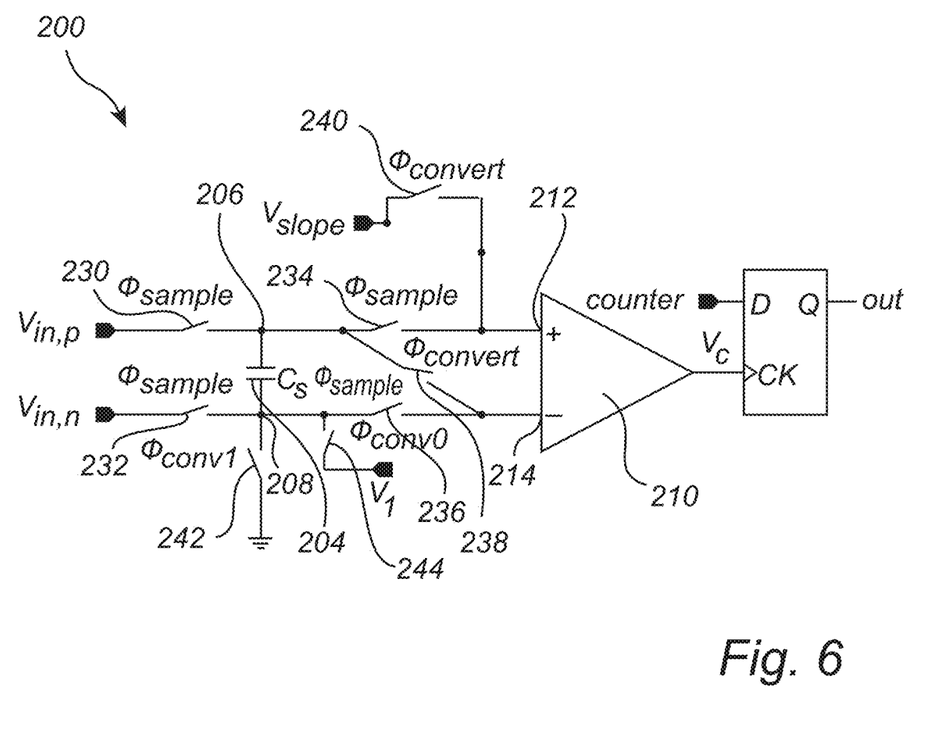
FIG. 6 is a schematic view of a slope ADC according to a second embodiment.

Referring now to FIG. 6, a slope ADC 200 according to another embodiment will be disclosed. All details of the slope ADC 200 will not be discussed below. Rather, the slope ADC 200 provides a different layout of switches compared to the slope ADC 100 described above. Hence, below only the differences to the slope ADC 100 will be described.

The slope ADC 200 shown in FIG. 6 comprises sampling switches 230, 232, 234, 236 arranged in a similar manner as set forth above for the slope ADC 100. Thus, the comparator 210 of the slope ADC 200 receives the analog input signal during the tracking period for determining the most significant bit during the tracking period.

The slope ADC 200 further comprises a conversion switch 238 for selectively connecting the first terminal 206 of the sampling capacitor 204 to the comparator 210 during the conversion period. The conversion switch 238 will always be activated during the conversion period such that the first terminal 206 of the sampling capacitor 204 will always be connected to the comparator 210 during the conversion period.

The slope ADC 200 further comprises a conversion switch 240 for connecting the slope signal to the input to the comparator 210 during the conversion period. The conversion switch 240 will also always be activated during the conversion period such that the same slope signal will always be connected to the comparator 210 during the conversion period.

The slope ADC 200 further comprises a conversion switch 242, which is configured to control connections within the slope ADC 200 when the first analog input signal $V_{in,p}$ is larger than the second analog input signal $V_{in,n}$ and a conversion switch 244 which is configured to control connections within the slope ADC 200 when the first analog input signal $V_{in,p}$ is smaller than the second analog input signal $V_{in,n}$.

Figure 7:
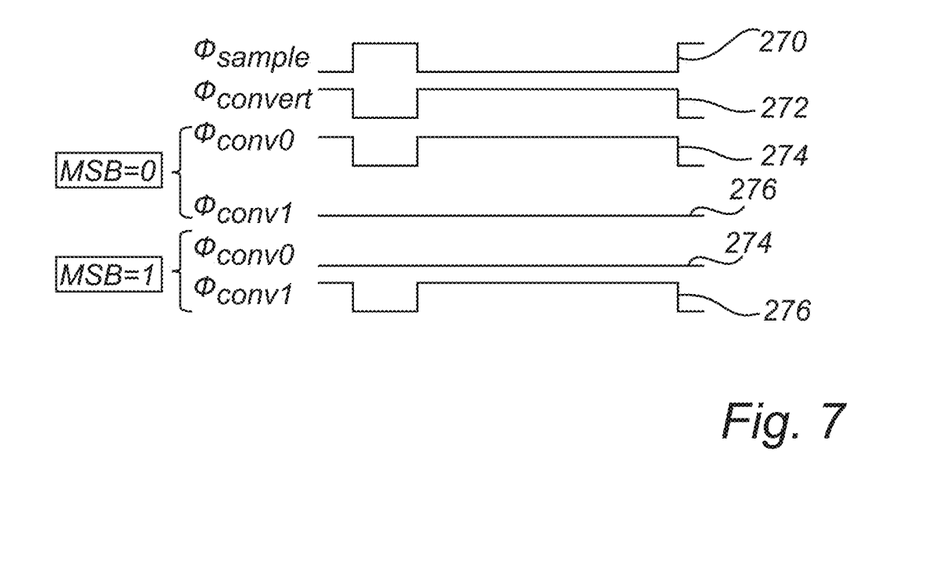
FIG. 7 is a schematic view illustrating control signals to switches of the slope ADC of the second embodiment.

As shown in FIG. 7, a signal 270 to the sampling switches 230, 232, 234, 236 is high during the tracking periods and low therebetween. Further, a signal 272 to the conversion switches 238, 240 is low during the tracking periods and high therebetween. In case the first analog input signal $V_{in,p}$ is smaller than the second analog input signal $V_{in,n}$, i.e. the most significant bit is determined to be 0, the signal 274 to the conversion switch 244 is high during the conversion periods and low therebetween and the signal 276 to the conversion switch 242 is constantly low. In case the first analog input signal $V_{in,p}$ is larger than the second analog input signal $V_{in,n}$, i.e. the most significant bit is determined to be 1, the signal 274 to the conversion switch 244 is constantly low and the signal 276 to the conversion switch 242 is high during the conversion periods and low therebetween.

This implies that, when the most significant bit is determined to be 1, i.e. the first analog input signal $V_{in,p}$ is larger than the second analog input signal $V_{in,n}$, the first terminal 206 of the sampling capacitor 204 is connected via conversion switch 238 to the negative terminal 214 of the comparator 210 and the second terminal 208 of the sampling capacitor 204 is connected via conversion switch 242 to ground.

Further, when the most significant bit is determined to be 0, i.e. the first analog input signal $V_{in,p}$ is smaller than the second analog input signal $V_{in,n}$, the first terminal 206 of the sampling capacitor 204 is connected via conversion switch 238 to the negative terminal of the comparator 210 and the second terminal 208 of the sampling capacitor 204 is connected via conversion switch 244 to a fixed reference voltage $V_1$. The fixed reference voltage $V_1$ may set an upper limit of a signal level received at the negative terminal 214 of the comparator and may for instance correspond to supply voltage $V_{DD}$.

The conversion switches 242, 244 may thus be configured to selectively control whether the second terminal 208 of the sampling capacitor 104, which terminal is not connected to the input to the comparator 210, is to be connected to ground or to the fixed reference voltage $V_1$.

With the configuration illustrated in FIGS. 6-7, the analog input signal received at the input to the sampling capacitor 204 may be attenuated in the same way regardless of signal level to an input signal received on the negative terminal 114 of the comparator 110. Thus, the signal V_ received on the negative terminal 114 of the comparator 110 may be given as:

$$V_- = \begin{cases} \frac{C_s - C_p/2}{C_s + C_p} V_{in} + \frac{C_p}{C_s + C_p} V_{cm,in}, & V_{in} > 0 \\ \frac{C_s + C_p/2}{C_s + C_p} V_{in} + \frac{C_p}{C_s + C_p} V_1 + \frac{C_p}{C_s + C_p} V_{cm,in}, & V_{in} < 0 \end{cases}.$$

In the configuration illustrated in FIGS. 6-7, the slope ADC 200 may be configured to use a slope signal that is monotonically increasing independently of the determined most significant bit.

Figure 8:
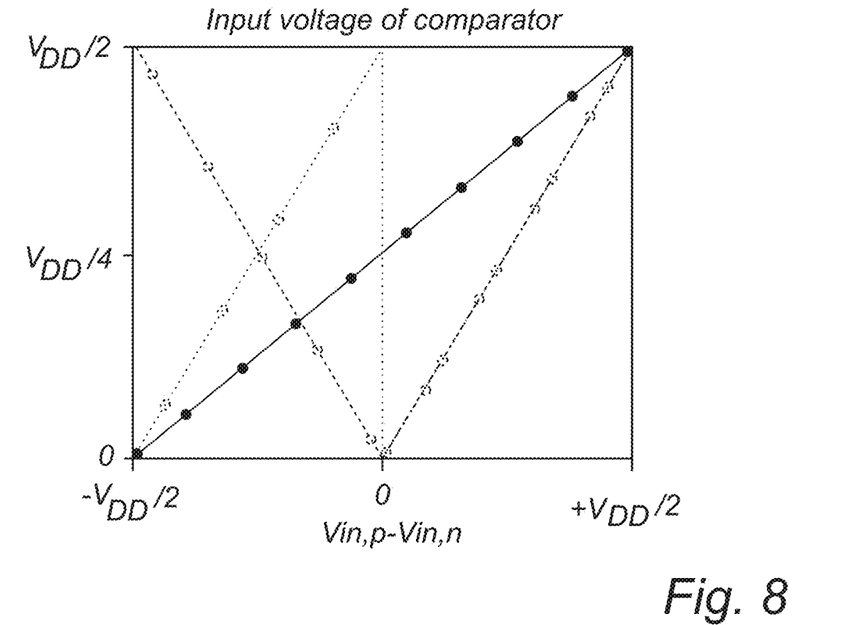
FIG. 8 is a graph illustrating a transfer function from an analog input signal to the slope ADC to an input signal to a comparator of the slope ADC during conversion period.

In FIG. 8, a transfer function from the analog input signal received at the sampling capacitor to the signal at the input of the comparator is indicated for the slope ADC 100 having the configuration illustrated in FIGS. 1-5 (dashed line), for the slope ADC 200 having the configuration illustrated in FIGS. 6-7 (dotted line), and for a slope ADC that does not determine the most significant bit before the conversion period (solid line).

As is clear from FIG. 8, the transfer function provides a folding of the analog input signal for the slope ADC 100 and for the slope ADC 200 such that there is no need to attenuate the analog input signal in order to fit the operating range of the comparator.

Figure 9:
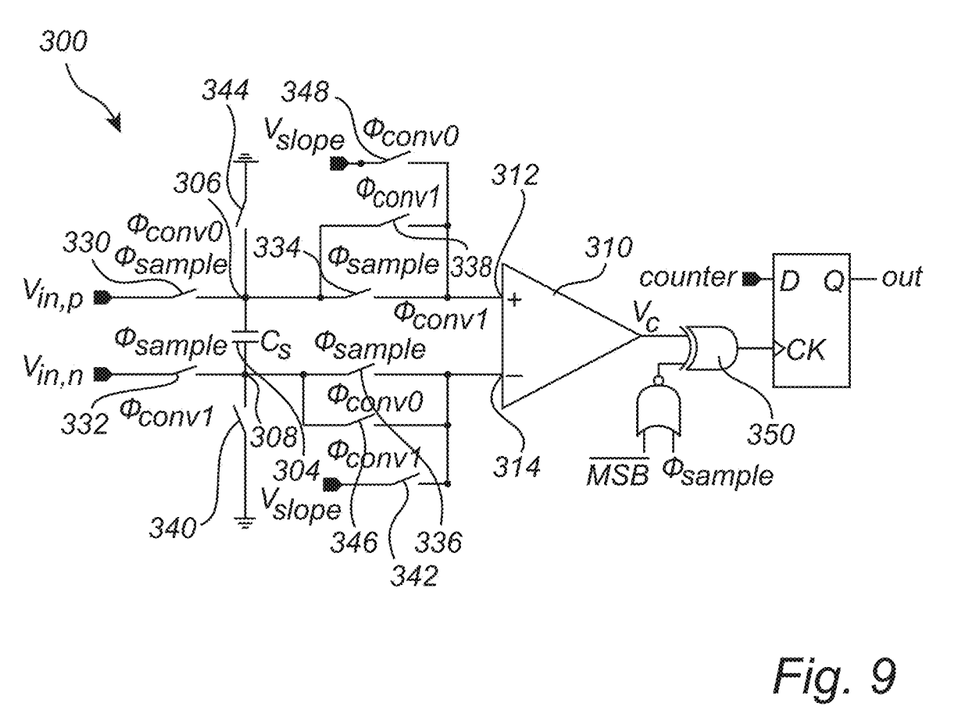
FIG. 9 is a schematic view of a slope ADC according to a third embodiment.

Referring now to FIG. 9, a slope ADC 300 according to another embodiment will be disclosed. All details of the slope ADC 300 will not be discussed below. Rather, the slope ADC 300 provides a different layout of switches compared to the slope ADC 100 and the slope ADC 200 described above. Hence, below only the differences to the slope ADC 100 will be described.

The slope ADC 300 shown in FIG. 9 comprises sampling switches 330, 332, 334, 336 arranged in a similar manner as set forth above for the slope ADCs 100, 200. Thus, the comparator 310 of the slope ADC 300 receives the analog input signal during the tracking period for determining the most significant bit during the tracking period.

The slope ADC 300 further comprises conversion switches for selectively controlling which of the first terminal 306 and the second terminal 308 of the sampling capacitor 304 that is connected to the input to the comparator 310 during the conversion period.

The slope ADC 300 comprises conversion switches 338, 340, 342, which are configured to control connections within the slope ADC 300 when the first analog input signal $V_{in,p}$ is larger than the second analog input signal $V_{in,n}$ and conversion switches 344, 346, 348, which are configured to control connections within the slope ADC 300 when the first analog input signal $V_{in,p}$ is smaller than the second analog input signal $V_{in,n}$.

When the most significant bit is determined to be 1, i.e. the first analog input signal $V_{in,p}$ is larger than the second analog input signal $V_{in,n}$, the first terminal 306 of the sampling capacitor 304 is connected via conversion switch 338 to the positive terminal 312 of the comparator 310 and the second terminal 308 of the sampling capacitor 304 is connected via conversion switch 340 to ground. Further, a slope signal is provided to the negative terminal 314 of the comparator 310 via conversion switch 342.

When the most significant bit is determined to be 0, i.e. the first analog input signal $V_{in,p}$ is smaller than the second analog input signal $V_{in,n}$, the first terminal 306 of the sampling capacitor 304 is connected via conversion switch 344 to ground and the second terminal 308 of the sampling capacitor 304 is connected via conversion switch 346 to the negative terminal 314 of the comparator 310. Further, the slope signal is provided to the positive terminal 312 of the comparator 310 via conversion switch 348.

Thus, the plurality of switches of the slope ADC 300 is configured to selectively control one of the first terminal 306 and the second terminal 308 of the sampling capacitor 304 to be connected to the input to the comparator 310. The first terminal 306 of the sampling capacitor 304 is selectively connected to a positive terminal 312 of the input to the comparator 310 and the second terminal 308 of the sampling capacitor 304 is selectively connected to a negative terminal 314 of the input to the comparator 310. The plurality of switches is further configured to selectively connect a slope signal to the negative terminal 314 or the positive terminal 314 of the comparator 310. Thus, the slope signal is provided at different input terminals of the comparator 310 depending on whether the most significant bit is zero or one. The slope ADC 300 may further comprise an XOR gate 350 which conditionally inverts an output of the comparator 310 so that toggling of the output is always triggered at a rising edge.

With the configuration illustrated in FIG. 9, the analog input signal received at the input to the sampling capacitor 304 may be attenuated in the same way regardless of signal level to an input signal received by the comparator 110. Thus, the signal $V_-$ received on the positive terminal 312 or negative terminal 314 of the comparator 310 may be given as:

$$\begin{cases} V_+ = \frac{C_s + C_p/2}{C_s + C_p} V_{in} + \frac{C_p}{C_s + C_p} V_{cm,in}, & V_{in} > 0 \\ V_- = -\frac{C_s + C_p/2}{C_s + C_p} V_{in} + \frac{C_p}{C_s + C_p} V_{cm,in}, & V_{in} < 0 \end{cases}$$

Figure 10:
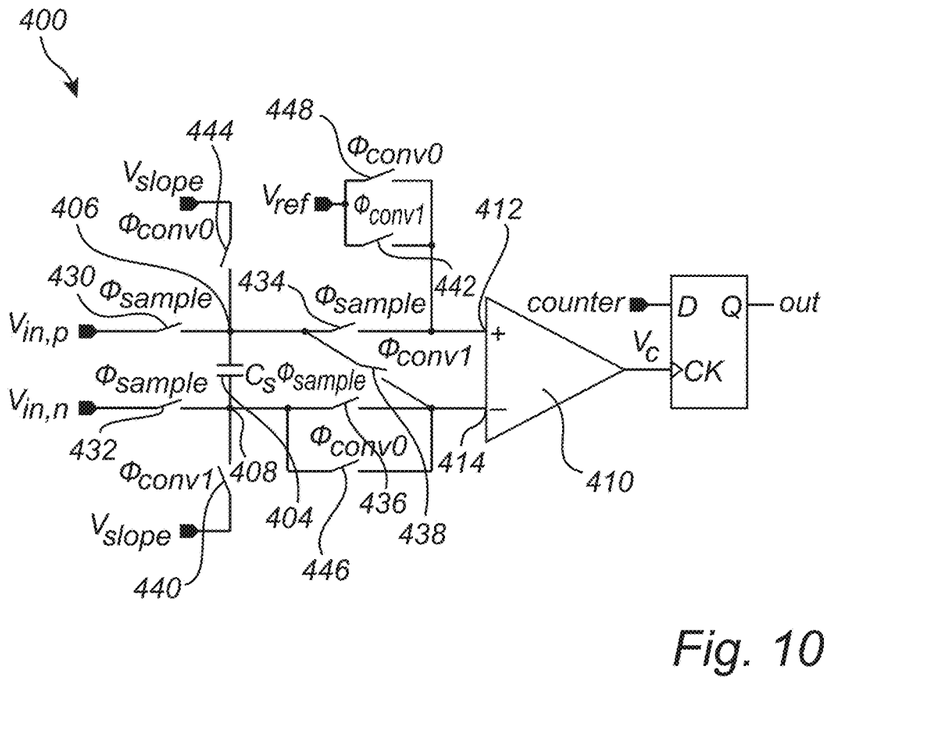
FIG. 10 is a schematic view of a slope ADC according to a fourth embodiment.

Referring now to FIG. 10, a slope ADC 400 according to another embodiment will be disclosed. All details of the slope ADC 400 will not be discussed below. Rather, the slope ADC 400 provides a different layout of switches compared to the slope ADC 100, the slope ADC 200, and the slope ADC 300 described above. Hence, below only the differences to the slope ADC 100 will be described.

The slope ADC 400 shown in FIG. 10 comprises sampling switches 430, 432, 434, 436 arranged in a similar manner as set forth above for the slope ADCs 100, 200, 300. Thus, the comparator 410 of the slope ADC 400 receives the analog input signal during the tracking period for determining the most significant bit during the tracking period.

The slope ADC 400 further comprises conversion switches for selectively controlling which of the first terminal 406 and the second terminal 408 of the sampling capacitor 404 that is connected to the input to the comparator 410 during the conversion period.

The slope ADC 400 comprises conversion switches 438, 440, 442, which are configured to control connections within the slope ADC 400 when the first analog input signal $V_{in,p}$ is larger than the second analog input signal $V_{in,n}$ and conversion switches 444, 446, 448, which are configured to control connections within the slope ADC 400 when the first analog input signal $V_{in,p}$ is smaller than the second analog input signal $V_{in,n}$.

When the most significant bit is determined to be 1, i.e. the first analog input signal $V_{in,p}$ is larger than the second analog input signal $V_{in,n}$, the first terminal 406 of the sampling capacitor 404 is connected via conversion switch 438 to the negative terminal 414 of the comparator 410 and the second terminal 408 of the sampling capacitor 404 is connected via conversion switch 440 to a slope signal. Further, a reference signal is provided to the positive terminal 412 of the comparator 410 via conversion switch 442.

When the most significant bit is determined to be 0, i.e. the first analog input signal $V_{in,p}$ is smaller than the second analog input signal $V_{in,n}$, the first terminal 406 of the sampling capacitor 404 is connected via conversion switch 444 to a slope signal and the second terminal 408 of the sampling capacitor 404 is connected via conversion switch 446 to the negative terminal 414 of the comparator 410. Further, the reference signal is illustrated as being provided to the positive terminal 412 of the comparator 410 via conversion switch 448, but it should be realized that the same reference signal may be provided regardless whether the most significant bit is determined to be 0 or 1, so the same switch may be used in both cases.

Thus, the plurality of switches of the slope ADC 400 is configured to control the first terminal 406 or the second terminal 408 of the sampling capacitor 404 not being connected to the input to the comparator 310 to be connected to the slope signal. The comparator 410 is further configured to receive a reference signal during the conversion period.

Thus, the comparator 410 is configured to, independently of the determined most significant bit, compare a combination of the sampled value and the slope signal to a fixed reference voltage $V_{ref}$ of the reference signal.

Figure 11:
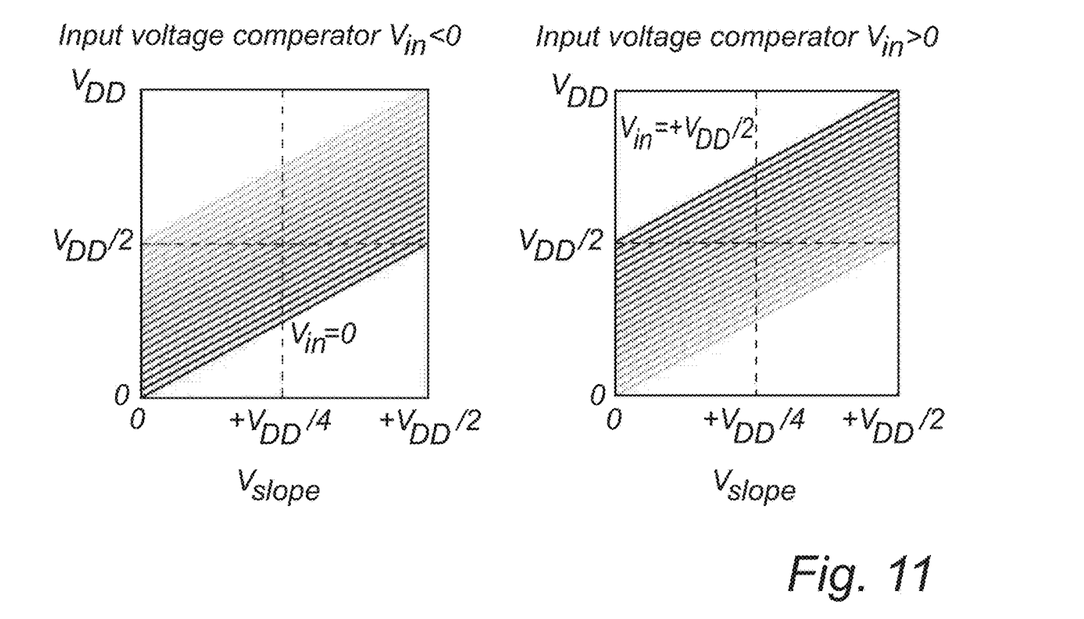
FIG. 11 is a graph illustrating an input signal to a comparator of the slope ADC as a function of a slope signal.

Referring now to FIG. 11, the slope ADC 400 provides a shift of the slope voltage received by the comparator 410, wherein the shift is dependent on the sampled value of the analog input signal. The output of the comparator 410 then always toggles when the shifted slope voltage gets equal to $V_{ref}$, which would be $V_{DD}/2$ in FIG. 11. This implies that the design of the comparator 410 may be very simple. While the signal at the negative terminal 414 of the comparator 410 can be anywhere between 0 and $V_{DD}$, the only critical point is around $V_{ref}$. Thus, properties of the comparator 410, like offset, noise and speed are now completely independent of a signal level of the analog input signal.

Figure 12:
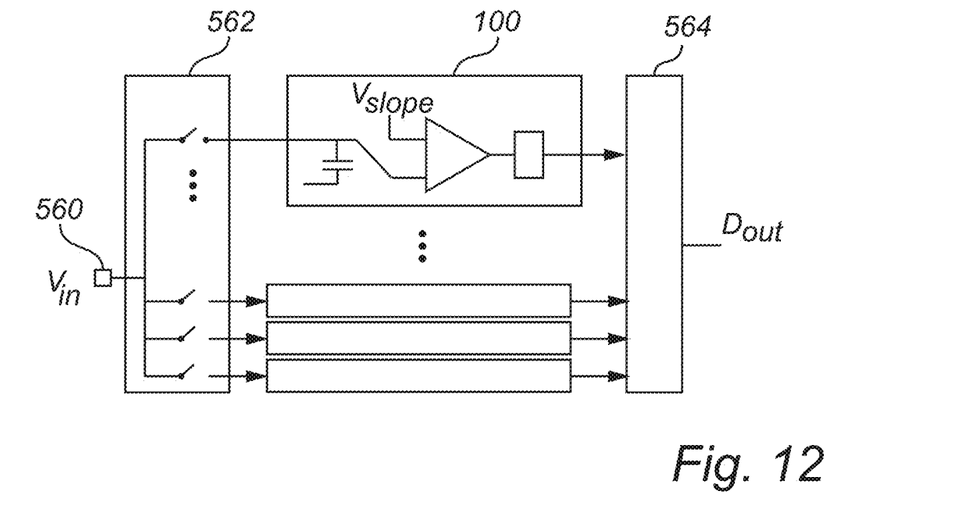
FIG. 12 is a schematic view of a time-interleaved ADC according to an embodiment.

Referring now to FIG. 12, a time-interleaved ADC 500 will be described. The time-interleaved ADC 500 may comprise a plurality of slope ADCs 100, 200, 300, 400 according to any one of the embodiments described above. Although hereinafter reference is made to slope ADC 100, it should be realized that slope ADCs according to any of the other embodiments may be used.

The plurality of slope ADCs 100 may be arranged in parallel in order to achieve a plurality of parallel analog-to-digital conversion channels. The time-interleaved ADC 500 may comprise common input nodes 502 for receiving the analog input signal. For simplicity, only a single input node 502 is shown, but it should be realized that two input nodes may be used for receiving a differential analog input signal.

The plurality of slope ADCs 100 are connected to the common input node 560 via a time-interleaved sampling arrangement 562. The time-interleaved sampling arrangement 562 is configured to successively in time provide the analog input signal to each of the plurality of slope ADCs 100. Each of the slope ADCs 100 may thus obtain a sampled value of the analog input signal such that different slope ADCs 100 obtain sampled values representing the analog input signal at different points in time. This allows that plurality of ADCs 100 to be jointly used for increasing the sampling rate of the time-interleaved ADC 500.

The digital representation provided by each of the plurality of slope ADCs 100 may be output to a data aligner 564 which may combine the digital representation of the analog input signal from the plurality of slope ADCs 100 to form a combined sequence of digital values forming a complete digital representation of the analog input signal.

The slope ADCs 100 described herein allow an improved resolution and/or an improved speed of analog-to-digital conversion. Thus, since a sampling rate of the slope ADCs 100 is large, the number of slope ADCs 100 needed to be used in the time-interleaved ADC 500 may be decreased to allow a very compact implementation of the time-interleaved ADC 500.

Figure 13:
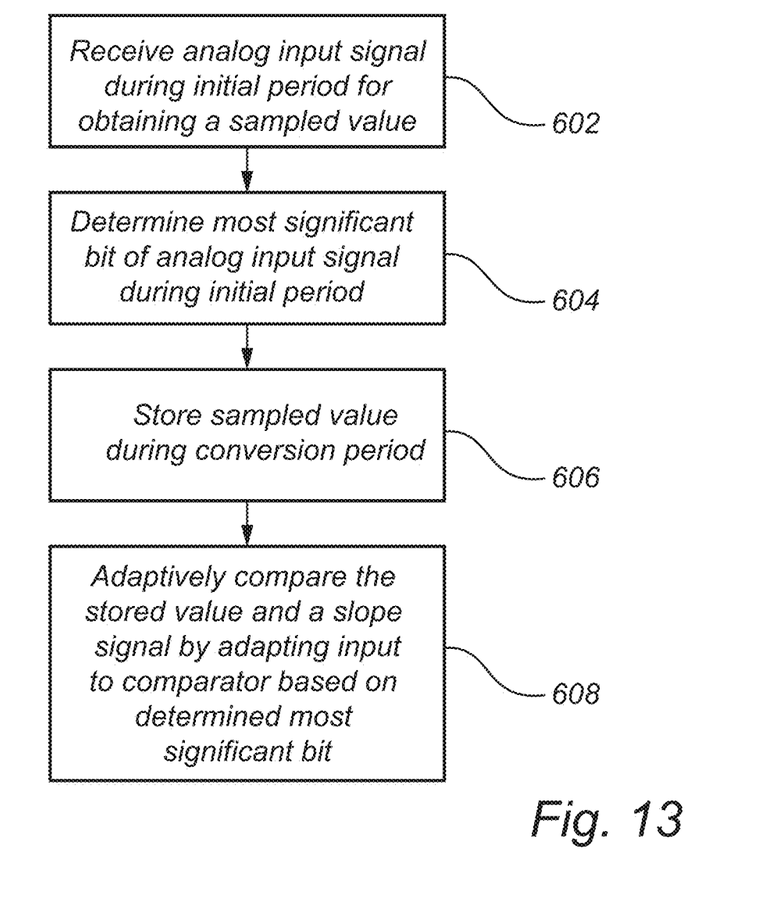
FIG. 13 is a flow chart of a method according to an embodiment.

Referring now to FIG. 13, a method for analog-to-digital conversion of an analog input signal will be briefly described.

The method comprises receiving 602 an analog input signal during an initial period at an input unit comprising a sampling capacitor for obtaining a sampled value of the analog input signal. The analog input signal may be received by a track and hold unit, which during a tracking period obtains a sampled value of the analog input signal.

The method further comprises determining 604 a most significant bit of the analog input signal during the initial period. The most significant bit may be determined during the tracking period of a track and hold unit, such that the most significant bit is already determined when a sampled value ready for being converted to digital representation is obtained.

The method further comprises storing 606 the sampled value during a conversion period. The sampled value may be stored by a sampling capacitor.

The method further comprises adaptively comparing 608 by a comparator the stored sampled value and a slope signal for converting the stored sampled value to a digital representation. The input to the comparator is adapted based on the determined most significant bit. This implies that the slope signal need not assume signal levels corresponding to all possible values of the analog input signal. Rather, by the most significant bit being determined during the initial period, the range of values of the slope signal may be significantly decreased.

The comparator may be configured to directly compare the sampled value and the slope signal. However, the comparator may be configured to compare two signal values, involving the sampled value and a slope signal such that one of the signal values has a monotonically increasing or monotonically decreasing value. In an embodiment, one of the two signal values may be a combination of the sampled value and the slope signal and the combined sampled value and the slope signal may be compared to a reference signal level.

In the above the inventive concept has mainly been described with reference to a limited number of examples. However, as is readily appreciated by a person skilled in the art, other examples than the ones disclosed above are equally possible within the scope of the inventive concept, as defined by the appended claims.

The invention claimed is:

1. A slope analog-to-digital converter, ADC, for converting an analog input signal to a digital representation, said ADC comprising:
an input unit comprising a sampling capacitor, wherein the input unit is configured to receive the analog input signal during an initial period for obtaining a sampled value of the analog input signal and wherein the input unit is configured to, during a conversion period, hold the sampled value of the analog input signal across the sampling capacitor between a first terminal and a second terminal of the sampling capacitor; and
a comparator which is configured to determine a most significant bit of the analog input signal during the initial period;
wherein the ADC during the conversion period is configured to receive a slope signal and to be adapted based on the determined most significant bit such that the comparator is further configured to adaptively compare the sampled value and the slope signal for converting the sampled value to a digital representation.

2. The ADC according to claim 1, wherein the input unit is a track and hold unit and wherein the input unit is configured to track the received analog input signal thereby obtaining the sampled value of the analog input signal.

3. The ADC according to claim 1, wherein the ADC comprises at least one switch for selectively controlling an input to the comparator, during the conversion period and in dependence of the determined most significant bit, thereby connecting the input to the comparator to the first terminal or the second terminal of the sampling capacitor.

4. The ADC according to claim 3, wherein the at least one switch comprises a plurality of switches for selectively controlling which of the first terminal and the second terminal of the sampling capacitor is connected to the input to the comparator during the conversion period.

5. The ADC according to claim 4, wherein the sampling capacitor is configured to be connected to a first terminal of the input to the comparator regardless of the determined most significant bit.

6. The ADC according to claim 5, wherein the plurality of switches is configured to control the first terminal or the second terminal of the sampling capacitor not being connected to the input to the comparator during the conversion period to be connected to the slope signal, and wherein the comparator is configured to be further connected at the input to a reference signal during the conversion period.

7. The ADC according to claim 1, wherein the comparator is configured to compare a combination of the sampled value and the slope signal to a first fixed reference voltage independently of the determined most significant bit.

8. The ADC according to claim 4, wherein the plurality of switches is configured to selectively control one of the first terminal and the second terminal of the sampling capacitor to be connected to the input to the comparator, wherein the first terminal of the sampling capacitor is selectively connected to a first terminal of the input to the comparator and the second terminal of the sampling capacitor is selectively connected to a second terminal of the input to the comparator, and wherein the plurality of switches is further configured to selectively connect a slope signal to the first terminal or the second terminal of the comparator, such that the input to the comparator is connected to one of the capacitor terminals and a slope signal.

9. The ADC according to claim 3, wherein the at least one switch is configured to selectively control whether the terminal of the sampling capacitor which is not connected to the input to the comparator is to be connected to ground or to a second fixed reference voltage.

10. The ADC according to claim 1, wherein the analog input signal is a differential analog input signal comprising a first analog input signal and a second analog input signal and wherein the comparator is configured to receive the first analog input signal and the second analog input signal on a first terminal and a second terminal of the input to the comparator, respectively, during the initial period.

11. The ADC according to claim 1, wherein the ADC is configured to provide a slope signal which corresponds to levels of the sampled value encompassing more than half of possible values of the digital representation so as to provide a check of determination of the most significant bit.

12. A time-interleaved analog-to-digital converter, ADC, comprising:
a plurality of slope ADCs according to claim 1, wherein the plurality of slope ADCs are configured to receive the analog input signal successively in time.

* * * * *